United States Patent [19]
Seshadri

[11] Patent Number: 5,263,033
[45] Date of Patent: Nov. 16, 1993

[54] JOINT DATA AND CHANNEL ESTIMATION USING FAST BLIND TRELLIS SEARCH

[75] Inventor: Nambirajan Seshadri, Madison, N.J.

[73] Assignee: AT&T Bell Laboratories, Murray Hill, N.J.

[21] Appl. No.: 542,458

[22] Filed: Jun. 22, 1990

[51] Int. Cl.$^5$ .............................................. G06F 11/10
[52] U.S. Cl. ...................................... 371/43; 371/44; 371/46; 375/34; 375/39
[58] Field of Search ....................... 371/43, 44, 45, 46; 375/34, 39, 14, 99, 58, 11, 12

[56] References Cited

U.S. PATENT DOCUMENTS

| | | | |
|---|---|---|---|
| 4,646,305 | 2/1987 | Tretter | 371/43 |
| 4,745,625 | 5/1988 | Eyuboglu | 371/43 X |
| 4,833,693 | 5/1989 | Eyuboglu | 371/43 X |
| 4,847,864 | 7/1989 | Cupo | 375/14 |
| 4,862,483 | 8/1989 | Clark | 371/43 X |

OTHER PUBLICATIONS

S. U. H. Quereshi, "Adaptive Equalization", *Proceedings of the IEEE*, vol. 73, pp. 1349–1387 (Sep. 1985).
Sato, "A Method of Self-Recovering Equalization for Multilevel Amplitude Modulation", *IEEE Transactions on Communications*, vol. COM-29, pp. 679–683 (Jun. 1975).
D. N. Goddard, "Self-Recovering Equalization and Carrier Tracking in Two-Dimensional Data Communications Systems", *IEEE Transactions on Communications*, vol. COM-28, pp. 1867–1875 (Nov. 1980).
A. Benveniste, M. Goursat, "Blind Equalizers", *IEEE Transactions on Communications*, vol. COM-32, pp. 871–883 (Aug. 1984).
G. J. Foschini, "Equalizing Without Altering or Detecting Data", *Bell System Technical Journal*, pp. 1885–1912, (Oct. 1985).
G. Picchi, G. Prati, "Blind Equalization and Carrier Recovery Using a Stop-and-Go Decision Directed Algorithm", *IEEE Transactions on Communications*, vol. COM-35, pp. 877–887, (Sep. 1987).
N. K. Jablon, "Joint Blind Equalization, Carrier Recovery and Timing Recovery for 64-QAM and 128-QAM Signal Constellations", *Proc. ICC89*, pp. 1043–1049.
O. Macchi, A. Hachicha, "Self-Adaptive Equalization Based on a Prediction Principle", *Proc. IEEE Globecom'86*, pp. 1641–1645.
J. B. Anderson, S. Mohan, "Sequential Coding Algorithms:A Survey and Cost Analysis", *IEEE Transactions on Communications*, vol. COM-32, pp. 1689–1696 (Feb. 1984).
J. Salz, "On the Start-up Problem in Digital Echo Cancelers", *Bell Systems Technical Journal*, vol. 62, pp. 1353–1364, Jul.-Aug. (1983).
V. Weerackody, S. A. Kassam, K. R. Laker, "Dual-Mode Type Algorithms for Blind Equalization", *IEEE Transactions on Communications*, pp. 1–23.

*Primary Examiner*—Robert W. Beausoliel, Jr.
*Assistant Examiner*—Ly V. Hua
*Attorney, Agent, or Firm*—William Ryan

[57] ABSTRACT

A blind equalization technique for a data communications channel, i.e., one that does not require the explicit use of a training sequence to learn the channel. Instead, for every possible sequence that can be transmitted, it finds the best possible channel fit corresponding to the noisy channel output sequence (typically using the least squares procedure). Finally, the data and the channel are estimated to be those with the overall best fit. This simple but exhaustive search procedure can advantageously use a sub-optimal trellis search algorithm to achieve in present performance with only linear complexity.

21 Claims, 7 Drawing Sheets

JOINT DATA AND CHANNEL ESTIMATION USING FAST BLIND TRELLIS SEARCH

FIELD OF THE INVENTION

This invention relates to equalization for communication channels and for estimation of information bearing signals received from such channels. This invention also relates to such equalization and estimation by techniques which completely avoid the need for training sequences or drastically reduces the amount of such training required prior to the transmission of information signals.

BACKGROUND OF THE INVENTION

In practice, decoders (equalizers) for data that are transmitted over channels with unknown distortion require the use of a known training sequence for "learning" the channel before any decoding is attempted (see, e.g., S. U. H. Quereshi, "Adaptive Equalization," Proceedings of the IEEE, Vol. 73, pp. 1349–1387, September 1985). Such learning typically involves deriving parameters (e.g., filter coefficients) that characterize the channel.

Sato, in his paper "A Method of Self-Recovering Equalization for Multilevel Amplitude Modulation," *IEEE Transactions on Communications*, Vol. COM-29, pp. 679–683, June 1975, demonstrated the feasibility of learning the channel, and hence performing equalization, without the help of a training sequence. This work of Sato on so-called "blind equalization" was later refined and analyzed for various applications (see, e.g., D. N. Goddard, "Self-Recovering Equalization and Carrier Tracking in Two-Dimensional Data Communication Systems," *IEEE Transactions on Communications*, Vol. COM-28, pp. 1867–1875, November 1980; A. Benveniste and M. Goursat, "Blind Equalizers," *IEEE Transactions on Communications*, Vol. COM-32, pp. 871–883, August 1984; G. J. Foschini, "Equalizing Without Altering or Detecting Data," *Bell System Technical Journal*, October 1985, pp. 1885–1912; G. Picchi and G. Prati, "Blind Equalization and Carrier Recovery Using a Stop-and-Go Decision Directed Algorithm," *IEEE Transactions on Communications*, Vol. COM-35, pp. 877–887, September 1987; N. K. Jablon, "Joint Blind Equalization, Carrier Recovery, and Timing Recovery for 64-QAM and 128-QAM Signal Constellations," *Proc. ICC89*, pp. 1043–1049; and O. Macchi and A. Hachicha, "Self-Adaptive equalization based on a prediction principle," *Proc. IEEE GLOBECOM'86*, pp. 1641–1645; and V. Weerackody). Existing algorithms for blind equalization typically require several thousand symbols to be received before they achieve reasonable convergence of the equalizer coefficients.

So-called decision-directed equalization algorithms have found many applications in data communications to track slow variations in a channel after an initial learning phase. In this mode, it is assumed that the output of the decoder is correct with high probability. Error signals based on these output symbols are then used to update the coefficients of the equalizer. If little or no training has been used, as in blind equalizer operation, the correct equalizer coefficients are not known initially. This causes the decisions at the equalizer output to be subject to a very high error probability, thus making further equalizer updates based on decision-feedback unreliable. Such decision-directed techniques have accordingly not heretofore been found suitable for use in blind equalization.

Recently, several new blind equalization algorithms have been developed which attempt to incorporate decision-directed techniques by automatically switching from a blind updating mode to a decision-directed mode whenever the error rates are judged to be low (see, O. Macchi and A. Hachicha, "Self-Adaptive Equalization Based on a Prediction Principle," *Proc. IEEE GLOBECOM'86*, pp. 1641–1645).

SUMMARY OF THE INVENTION

The present invention introduces blind equalization using decision-feedback from the beginning of transmission. This is done through the use of delayed decision decoding typified by the Viterbi algorithm (see, e.g., A. J. Viterbi and J. K. Omura, *Principles of Digital Communications and Coding*, McGraw-Hill, New York, 1979). Delayed decision techniques have also been used in source coding applications. See. N. S. Jayant and P. Noll, *Digital Coding of Waveforms—Principles and Applications to Speech and Video*, Prentice-Hall, Inc., 1984.

Since the output of the blind decoder is initially in error with high probability, the present invention, in typical embodiment, advantageously defers decoding until it can be done with greater reliability. More specifically, for every possible data sequence that could have been transmitted, a least squares channel fit corresponding to a received sequence is found. The data sequence and its channel fit that has the overall least squares error is then chosen. This search is advantageously done recursively and non-exhaustively as will be shown in more detail below.

Using the method of the present invention, it is possible to achieve very good convergence, typically within a few hundred symbols for 8-level and 4-level pulse amplitude modulation (PAM), and within one hundred symbols for binary PAM. A variety of channel estimation algorithms, e.g., least squares (Kalman) techniques, least mean squares (stochastic-gradient based) technique, and the sign version of the LMS algorithm can be shown to converge successfully in the context of the present invention.

DETAILED DESCRIPTION

Preliminaries

Figure 1:
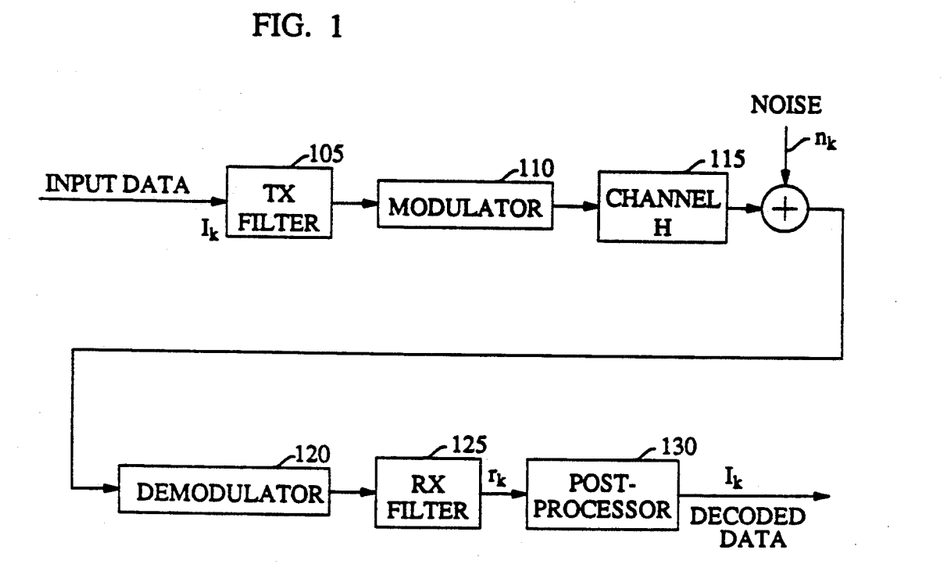
FIG. 1 shows a block diagram representation of a communication system using the present invention.

FIG. 1 shows a typical representation of a communication system incorporating the present invention. The input data, $I_k$, at each instant takes on one of M possible values $\{\pm 1, \pm 3, \ldots, \pm(M-1)\}$. The data are advantageously filtered by the transmit (Tx) filter 105 to, among other things, limit the bandwidth needed for transmission before being modulated by one of several well-known methods in modulator 110 onto a carrier. The modulated signal is transmitted over the channel 115 which introduces amplitude and/or phase distortion, which may be characterized in well-known fashion by a set of impulse response samples, h, as well as noise, $n_k$. The distorted signal is coherently demodulated in demodulator 120. Ideal phase recovery is conveniently assumed initially, but this will be relaxed in the sequel. The demodulated signal is filtered and sampled at the Nyquist rate in the receive (Rx) filter 125 to produce samples $\gamma_k$ before being further processed in post-processor (equalizer decoder) 130. The decoded data at time k is shown in FIG. 1 as $I_k$.

Throughout this description, one sample per signaling interval T is assumed (T-spaced samples). The sampled signal $r_k$ applied to post-processor 130 at time kT can be expressed as $$r_k = \sum_{i=0}^{L} a_{k-i} h_i + n_k \quad (1)$$

where $a_{k-i}$ is the symbol transmitted i sample times earlier, and $\{h_i\}_{i=0}^{L}$ is the sampled impulse response of the overall channel that comprises the transmit filter, modulator, the transmission medium, demodulator, the receive filter, and the T-spaced sampler. The product $a_{k-i} h_i$ is therefore the contribution of time k of a symbol transmitted at a time i intervals earlier. Throughout this description, the noise variate, $n_k$, is illustratively taken to be additive white Gaussian noise with zero mean, and unknown variance.

The transmit and the receive filters 115 and 125, respectively, are chosen so that in the absence of any distortion by the transmission medium (no amplitude or phase distortion), the sampled response satisfies $$h_i = \begin{cases} 1; & i=0 \\ 0; & \text{otherwise.} \end{cases} \quad (2)$$

This is accomplished in this typical embodiment by choosing the filters 115 and 125 to have a square-root Nyquist response so that their tandem will have a Nyquist response. The received signal $r_k$ at sample time kT is then $$r_k = a_k + n_k. \quad (3)$$

The data are then recovered by slicing the received signal to the data symbol that is closest to it. In the presence of distortion due to the transmission medium, Eq. (1) can be rewritten as $$r_k = a_k h_0 + \sum_{i \neq 0} a_{k-i} h_i + n_k. \quad (4)$$

The second term in the right-hand side of Eq. (4) is the inter-symbol interference. The decoder, in accordance with the present invention, advantageously exploits the memory introduced by the channel in performing reliable decoding of data.

Maximum Likelihood Sequence Estimation

It proves convenient to view the overall channel as a convolutional encoder that convolves the information data with a set of channel coefficients $\{h_i\}_{i=0}^{L}$ reflecting the dispersive effects, i.e., the memory, of the channel. This encoder then imposes a fixed signal pattern on the transmitted data. This signal pattern is assumed to be corrupted by additive white Gaussian noise. The decoder is a device that determines which data sequence, when convolved with the channel coefficients, produces a pattern which is most likely to be close to the received pattern. Thus, as used in this description, the term decoder includes the function of channel equalization, unless the context dictates otherwise.

Let the transmitted data sequence consist of N symbols and M be the number of signaling levels. Thus, there are $M^N$ possible data sequences, all assumed to be equally likely. Let the possible data sequences a(i) of length N be indexed from $i=1, \ldots, M^N$. The maximum likelihood sequence estimator (MLSE) chooses that data sequence a(m) as the MLSE of the transmitted data sequence if the probability inequality $$P(r/a(m)) > P(r/a(k)) \text{ for all } k \neq m \quad (5)$$

is satisfied. This can also be re-written as:

$$\text{Choose a(m) if } P(r/a(m)) \text{ is maximum.} \quad (6)$$

In principle Eq. (6) can be carried out by evaluating the probabilities $P(r/a(i))$, for $i=1, \ldots, M^N$ and choosing the data sequence that yields the maximum. However, the task becomes impractical even for moderate M and N. In practice, this search can be implemented without any loss of optimality by using the Viterbi algorithm.

Viterbi Algorithm

Generally, the class of delayed decision decoding algorithms includes the Viterbi algorithm (described, e.g., in A. J. Viterbi and J. K. Omura, *Principles of Digital Communication Coding*, McGraw-Hill, New York, 1979; and J. G. Proakis, *Digital Communications*, McGraw-Hill, New York, 1983), the generalized Viterbi algorithm (described in copending U.S. patent application by N. Seshadri and C. E. W. Sundberg assigned to the assignee of the present invention and entitled "Generalized Viterbi Decoding Algorithms", Ser. No. 07/395930 filed on Aug. 18, 1989) as well as sequential decoding algorithms (described, e.g., in J. B. Anderson and S. Mohan, "Sequential Coding Algorithms: A Survey and Cost Analysis, "*IEEE Transactions on Communications*, Vol. COM-32, pp. 1689-1696, February 1984. To avoid repetition of background and features described in cited Seshadri et al. patent application, that application is incorporated in its entirety by reference in the present description.

The use of the Viterbi algorithm (VA) in a decoding context is illustrated by considering the simple example of a unit memory channel, $(\{h_i\}_{i=0}^1 \neq 0; 0,$ otherwise) with binary signaling, $a_i \{\pm 1\}$.

The received signal at time k is $$r_k = a_k h_0 + a_{k-1} h_1 + n_k. \quad (7)$$

Figure 2:
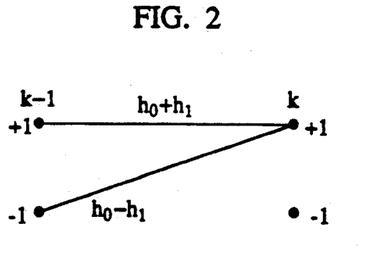
FIGS. 2, 3, and 4 show a trellis representation for a typical communication channel characterized by values $\{h_0, h_1\}$ to be used with binary inputs, e.g., $\{\pm 1\}$.
Figure 3:
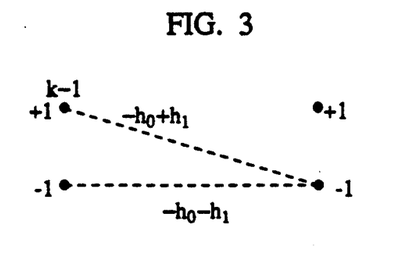

The channel output at time k (in the absence of noise) is completely characterized by the current input and the preceding input (which is the so-called state of the decoder—see the Proakis references cited above, for example). All possible channel sequences for this channel can be represented by the trellis diagram shown in FIGS. 2, 3, and 4. There, a solid line from a state at time $k-1$ to a state at time k indicates that the current input is 1. If the preceding input (current state) at time $k-1$ is $+1$, the output is $h_0 + h_1$, otherwise the output is $h_0 - h_1$ (FIG. 2). The new state in both situations is $S_k = +1$. The broken lines indicate that the current input is $-1$. If the preceding input (current state) at time $k-1$ is $+1$, the output is $-h_0 + h_1$, else the output is $-h_0 - h_1$ (FIG. 3). In both of the latter situations, the new state (at time k) is $S_k = -1$.

Figure 4:
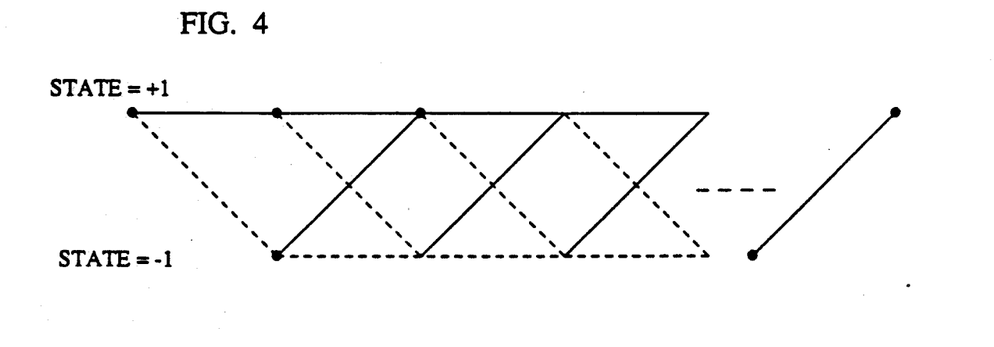

The trellis which shows the time evolution of the possible sequences is shown in FIG. 4 (which is merely a combination of FIGS. 2 and 3). The problem of maximum likelihood sequence estimation is to find among all the paths through the trellis, the path that satisfies Eq. (6). This is conveniently accomplished using the Viterbi algorithm.

Instead of maximizing the probability given in Eq. (6) for an additive white Gaussian noise variate, we can equivalently choose a(m) as the MLSE of the transmitted sequence, if it minimizes $$J(a(m)) = \sum_{i=-N}^{N-1} |r_i - [a_i(m)h_0 + a_{i-1}(m)h_1]|^2. \quad (8)$$

Here $a_i(m)$ is the $i^{th}$ symbol in sequence a(m). Eq. (8) reduces the problem to that of calculating the squared Euclidean distance between the received sequence and all possible channel outputs. We can rewrite Eq. (8) for a(m), and for any other sequence as $$J_k(a(m)) = J_{k-1}(a(m)) + |r_k - a_k(m)h_0 - a_{k-1}(m)h_1|^2. \quad (9)$$

The first term in the right-hand side (R.H.S.) of Eq. (9) is the path metric for sequence a(m) up to time $k-1$, i.e., for the first $k-1$ symbols of the sequence. The second term in the R.H.S. of Eq. (9) is the branch metric for the for the kth branch in the path for a(m). The VA performs the task of finding the path with the overall minimum metric by calculating at each instant of time, the path with the lowest metric into every state. Thus, in the example under consideration, for the kth state, $S_k$ given by $S_k = +1$ $$J_k(S_k = +1) = \min\{J_{k-1}(S_{k-1} = +1) + |r_k - h_0 - h_1|^2; J_{k-1}(S_{k-1} = -1) + |r_k - h_0 + h_1|^2\}. \quad (10)$$

The first term inside the braces in R.H.S. of Eq. (10) represents the path with the lowest metric into state $S_k = +1$ that passes through state $S_{k-1} = +1$. The second term represents the path with the lowest metric into the same state, which passes through $S_{k-1} = -1$. Similarly, the metric for the best path into state $S_k = -1$ is given by $$J_k(S_k = -1) = \min\{J_{k-1}(S_{k-1} = +1) + |r_k + h_0 - h_1|^2; J_{k-1}(S_{k-1} = -1) + |r_k + h_0 + h_1|^2\}. \quad (11)$$

In applying the Viterbi algorithm to MLSE of M-ary PAM signaling over a channel with memory L, there are $M^L$ states with M branches into each state. The minimization corresponding to that in Eq. (10) (or Eq. (11)) is performed over M terms, and $M^L$ such terms like (10) must be evaluated. The exponential growth in the number of states makes the Viterbi algorithm unattractive for large values of $M^L$.

In order to implement the Viterbi algorithm as described above, the channel impulse response should be known. In typical practice, however, the channel impulse response is estimated at the beginning of a transmission session by transmitting a known training sequence (learning) signal. One advantageous approach (described in J. Salz, "On the Start-up Problem in Digital Echo Cancelers," *Bell Systems Technical Journal*, Vol. 62, pp. 1353-1364, July-August 1983) uses a sequence of length $2L+1$ symbols in order to estimate the discrete channel impulse response of length $L+1$. Once the channel is estimated, it is used for data decoding by the Viterbi algorithm.

Adaptive Channel Impulse Response Estimation

Figure 5:
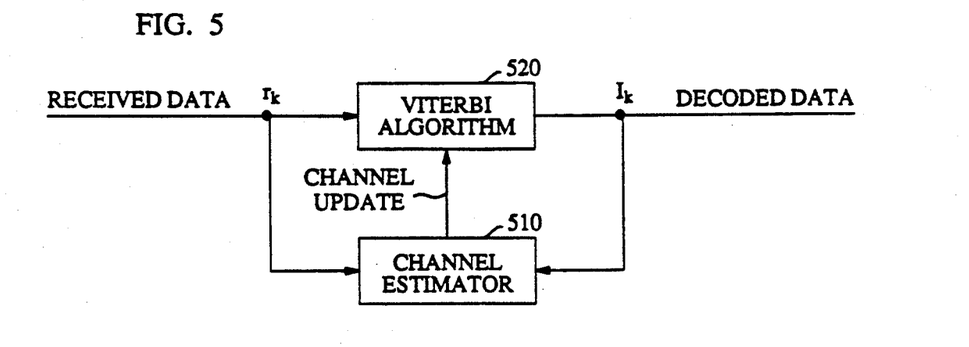
FIG. 5 shows the use of an adaptive Viterbi algorithm implementation in accordance with the present invention.

If a channel is changing slowly, then the past decoded data can be used to track the channel variations using a so-called stochastic-gradient approximation to least squares procedure. Thus, $$\hat{h}_{k+1} = \hat{h}_k + \alpha \left[ r_{k-\delta} - \sum_{i=0}^{L} \hat{a}_{k-\delta-i} \hat{h}_i \right] \cdot \hat{a}_{k-\delta}, \quad (12)$$

where
$$\hat{h}_{k+1} = [\hat{h}_0^{(k+1)}, \ldots, \hat{h}_L^{(k+1)}]^T$$

is the estimate of the channel impulse response at time $k+1$. The quantity $\delta$ is the decoding delay associated with the VA, and $$\hat{a}_{k-\delta} = [\hat{a}_{k-\delta}, \ldots, \hat{a}_{k-\delta-L}]^T$$

is the data that has been decoded with a delay $\delta$. This adaptive tracking procedure is shown in FIG. 5, where channel estimator 510 operates in accordance with Eq. (12) to supply updated channel coefficients for the Viterbi algorithm decoder 520.

Blind Equalization

Equalization techniques are called 'blind' when the data is decoded and (or) the channel is estimated without the aid of a training sequence. Most blind equalizers, for example those described in Sato, supra, update the receive filter coefficients so that the filter output has essentially the same probability distribution as the information sequence. For such a criterion, it has been shown that the equalizer coefficients converge, and its response approximates the inverse channel impulse response.

A major shortcoming of most blind equalizers is their inability to track the channel in a decision-directed (DD) mode until the equalizer has substantially converged. Recently, O. Macchi and A. Hachicha, in "Self-Adaptive Equalization Based on a Prediction Principle," *Conf. Rec. IEEE GLOBECOM'86*, pp. 1641-1645, and V. Weerackody, S. A. Kassam and K. R. Laker, in "Dual-Mode Type Algorithms for Blind Equalization," submitted to *IEEE Transactions on Communications*, have proposed DD blind equalizers, where the tap updating is inhibited whenever the decisions from the equalizer output are judged to be unreliable. Equalizer updating in a DD mode in accordance with these teachings is inhibited at start-up time because the decisions are likely to be incorrect with high probability. These techniques mainly provide a means of switching gracefully from blind to DD mode after the equalizer has converged to a reasonable extent.

Joint Data and Channel Estimation—Multipath Searching Generally

As has been demonstrated above, blind equalization and decision-directed adaptive updating of channel coefficients are well known in the art. Likewise, delayed decision decoding (using channel estimates) of received sequence has long been taught.

In accordance with one aspect of the present invention, delayed decision directed updates of the channel estimate are derived using multipath searching. Such multipath searching techniques are known in the art in various applications (see, e.g., A. J. Viterbi and J. K. Omura, *Principles of Digital Communication Coding*, McGraw-Hill, New York, 1979; J. B. Anderson and S. Mohan, "Sequential Coding Algorithms: A Survey and Cost Analysis," *IEEE Transactions on Communications*, Vol. COM-32, pp. 1689–1696, February 1984; and N. S. Jayant and P. Noll, *Digital Coding of Waveforms-Principles and Applications to Speech and Video*, Prentice-Hall, Inc., 1984).

Moreover, in accordance with another aspect of the present invention, the multipath searching is applied to data decoding simultaneously with the derivation of the channel estimates. Multi-path searching applied in its exhaustive form to joint channel estimation and data decoding finds a channel estimate for every possible data sequence $a(i)$, $i = 1, \ldots, M^N$, that could have been transmitted. Associated with each channel estimate is also a cost which is typically based on the minimum squared distance between each possible transmitted data sequence $a(i)$ and a received sequence $r$. In the absence of noise, the correct data sequence, say $a(*)$, will have the correct channel h as its estimate (the data sequence $b = -a(*)$ will have the channel estimate $-h$), while any other sequence will have an incorrect channel estimate. The least squares cost associated with the correct data sequence $a(*)$ (and b) is zero, while for any other sequence it is non-zero. For moderate to large signal-to-noise ratios, the true sequence will give rise to a channel estimate that is close to the actual channel, with the cost being the minimum when compared with that for all other possible data sequences.

The data and channel estimation rule is then to choose $a(m)$ and $h^*(a(m))$ as the transmitted data and the channel estimate if a) $h^*(a(m))$ is such that $$J(a(m)) = \sum_k \left| r_k - \sum_j a_{k-j}(m) h_j^*(a(m)) \right|^2 \quad (13)$$

is minimum for a given received sequence r and a specific data sequence $a(m)$, and b) $\sum_k \left| r_k - \sum_j a_{k-j}(m) h_j^*(a(m)) \right|^2 < \sum_k \left| r_k - \sum_j a_{k-j}(i) h_j^*(a(i)) \right|^2 \quad (14)$ for any $i \neq m$.

Here $h^*(a(i))$ is the least squares channel estimate assuming that the transmitted data sequence is $a(i)$. The data and channel estimation rule given above in connection with Eqs (13) and (14) can then be restated as: Find the sequence $a(i)$ and the channel estimate $h(a(i))$ such that $$\sum_k \left| r_k - \sum_j a_{k-j}(i) h_j(a(i)) \right|^2 \quad (15)$$

is minimum.

Joint Trellis Search Algorithm

Figure 6:
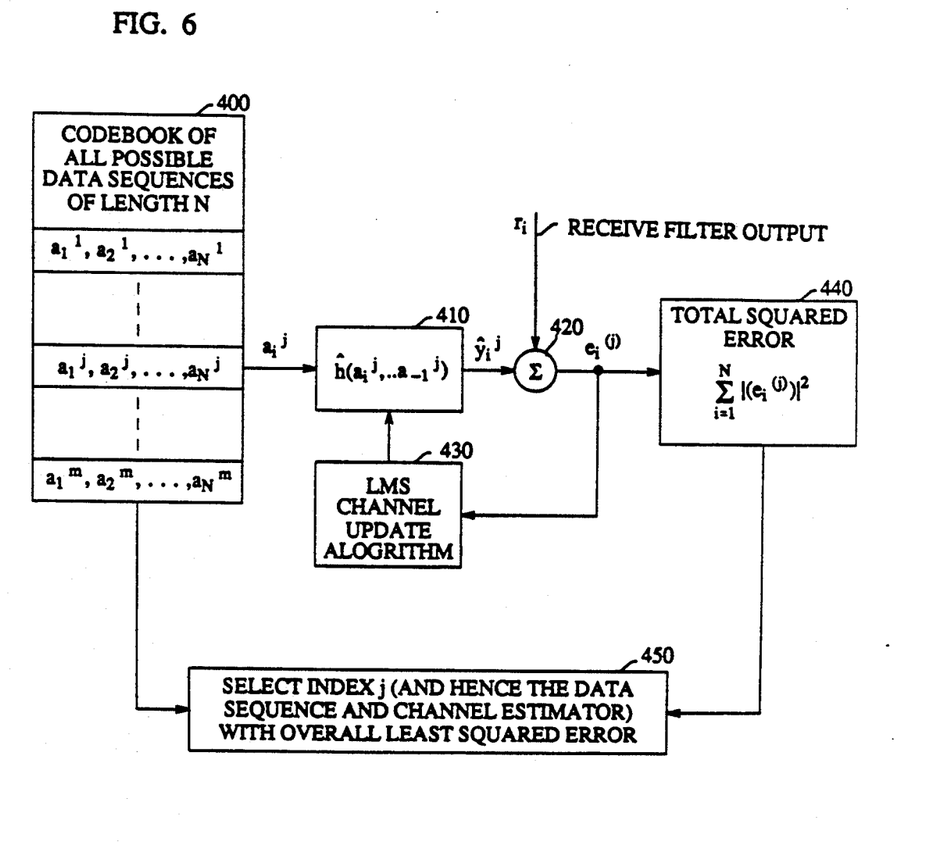
FIG. 6 shows a block diagram representation of an illustrative implementation of a blind equalization algorithm in accordance with the present invention.

FIG. 6 shows a block diagram representation of an implementation of an algorithm in accordance with one aspect of the present invention. FIG. 6 shows a codebook 400 having $m = M^N$ possible data sequences of length N which is repetitively cycled to have each sequence in turn applied to a convolution unit 410. Convolution unit 410 performs the operations associated with the j summation in Eq. (15). The output of unit 410 is then compared in comparator 420 with the actual received output from the receiver filter. The difference between the convolved sequence and the received sequence, the error, is applied to the unit 430 which performs an LMS channel update algorithm to adjust the h coefficients used in convolution block 410. The total squared error (as indicated by the summation over k in Eq. (15)) is stored in the unit 440 for each possible data sequence. The sequence having the lowest overall squared error is chosen to be the actual transmitted sequence in unit 450.

Since the channel estimates are not immediately correct in all cases (as when starting up in a blind equalization mode, or during channel fading), it proves advantageous to defer final decoding until the channel estimates, $h_j$, are more reliable. Thus when such conditions of unreliability exist, it proves useful to store received sequences, $r_k$, after they have been used to generate error signals and channel estimates. When the channel characteristics have been determined with greater certainty, these stored received sequences are then advantageously decoded as shown in FIG. 6 to yield high reliability estimates of the actual information symbols.

The task of performing the codebook search in order to perform the minimization in Eq. (15) may be impractical in many cases because there are $M^N$ data sequences in the codebook, an extremely large number even for moderate M and N.

Thus, in accordance with a preferred embodiment of the present invention, the requirements of Eq. (15) are advantageously met by an efficient sub-optimum trellis search procedure. This is equivalent to searching only a small subset of the codebook in FIG. 6 in order to estimate the channel. This reduced codebook search in accordance with the present invention is motivated, in part, by the Viterbi algorithm (VA) which exploits a state merging property in order to reduce the computation. First, it should be noted that if the channel impulse response is of finite duration, then all the possible channel outputs can be described by a trellis. The number of states in the trellis is $M^L$ where, as before, M is the number of different elements in the signaling alphabet (e.g., 2 for a binary alphabet), and L is the extent of channel memory, i.e., how many $h_j$ must be taken into account. The trellis representation reflects a channel, the output of which is determined only by the present input and the (present) state in which it resides. There are M paths entering and leaving each state.

The problem of finding the best data sequence is also performed efficiently by the present variation of the VA, which retains for further processing only the data sequence having the lowest metric among the sequences (paths) leading into each state. The rest of the paths are deleted.

However, as noted above, the channel impulse must be known when implementing the conventional VA. Thus to achieve important further efficiencies, it proves advantageous to simplify the decoding even further.

Before considering in more detail these preferred efficient codebook (trellis) search techniques to implement Eq. (15), it is helpful to consider some other limitations of the VA decoder. A first context in which VA limitations can be troubling is, has been noted, that where the channel impulse response is inaccurately represented at the receiver. This can either be due to lack of proper training, or, as will be seen, it can be due to inherent limitations of the conventional adaptive Viterbi algorithm.

Thus, it proves convenient to assume that, while undergoing a training phase, the receiver has determined an estimate of the channel impulse response that is not yet accurate. This impulse response estimate is then updated in a decision directed mode as explained above in connection with Eq. (12) and FIG. 5. The decision on the transmitted data symbol $a_k$ is made at the Viterbi decoder at time $k+\delta$, where $\delta$ is the decoding delay associated with the Viterbi algorithm. In order to produce reliable decisions, this delay should be several times the channel impulse response duration. However, if the channel is changing rapidly, as in a mobile receiver context, for example, the delay $\delta$ required to produce reliable data decisions, and hence to track the channels may not be available; the channel may change before a useful result is achieved.

This problem can be alleviated in accordance with an aspect of the present invention by updating the channel estimate with tentative data decisions that are obtained with a much smaller decoding delay. These decisions are based on the path with the lowest metric. The zero-delay tentative decisions are obtained at each instant by releasing immediately the data corresponding to the lowest metric path. However, these tentative decisions are much more unreliable compared to final data decisions that are obtained after the usual delay. This results in mis-tracking and consequent error propagation and therefore will not be appropriate for all applications.

Another limitation of the conventional adaptive Viterbi algorithm is its susceptibility to error in the channel estimate during the learning phase. This could be due to lack of proper training. Thus, use of the conventional adaptive Viterbi algorithm before training is complete (whether using reduced decoding delay, tentative, data estimates or final data estimates obtained using normal decoding delay), leads to many more errors than if the channel were known precisely. This also results in mis-tracking and hence error propagation. The improvement achieved in accordance with one aspect of the present invention overcomes these disadvantages associated with the conventional adaptive Viterbi algorithm.

Thus, in an efficient trellis search technique in accordance with one implementation of the present invention, one channel estimate is maintained for each state in the trellis. The channel estimate is obtained based on the locally best path into each state. Since the locally best path (data sequence) into each state is available without any delay, the channel estimate into each state can also be updated according to Eq. (12) without delay. As long as the correct data sequence remains as one of the locally best candidates, i.e., one of the best candidate data sequences at a given time k, the channel estimate for that path will be updated correctly at each instant. The correct path is eventually selected as that having the lowest metric and the sequence corresponding to the correct path is released as the decoded candidate. This adaptive Viterbi algorithm with multiple channel updating (one channel estimate for each state) based on locally best data sequences into each state does not suffer (i) from the delay problem, and (ii) is robust to mismatch (inaccuracies) in channel estimate as compared to the Viterbi algorithm with single channel estimate. This is the case whether the single channel estimate is based either on tentative or final decisions.

Figure 7:
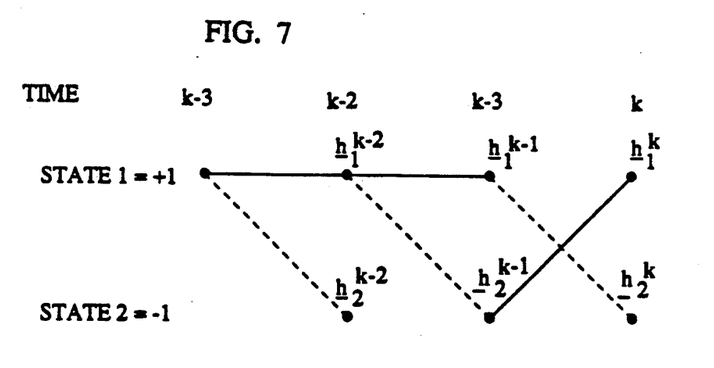
FIG. 7 shows a trellis diagram illustrating some operations in accordance with the present invention.

The improved channel updating procedure is illustrated in FIG. 7 for the trellis of FIG. 4. Let the metric for the known starting state (as determined, e.g., by a training sequence) be initialized to zero, and that for the other state(s) to a large positive value. Let the initial channel estimate at time=0 be $$\begin{bmatrix} h_0(S_0 = +1) \\ h_1(S_0 = +1) \end{bmatrix}$$

where $S_0 = +1$ denotes that the channel estimate that is attached to state $S_0 = +1$. For the purpose of illustration, let the known starting state be $S_0 = +1$ (i.e., the state of time 0 is $+1$). Then, for the 2-state per symbol trellis of FIG. 7, $$J_0(S_0 = +1) = 0; J_0(S_0 = -1) = +\infty.$$

FIG. 7 shows only a section of the trellis from time $k-3$ to k.

The adaptive Viterbi algorithm for state $S_k = +1$, computes the metric according to $$J_k(S_k = +1) = \min \{J_{k-1}(S_{k-1} = +1) + |\gamma_k - h_0(S_{k-1} = +1) - h_1(S_{k-1} = +1)|^2; J_{k-1}(S_{k-1} = +1) + |\gamma_k - h_0(S_{k-1} = -1) + h_1(S_{k-1} = -1)|^2\} \quad (16)$$

where $h_0(S_{k-1} = +1)$, $h_1(S_{k-1} = +1)$ are the channel impulse response coefficients at state $+1$ at time $k-1$. Similarly, the metric is evaluate at state $S_k = -1$. Having calculated the path with the least accumulated metric into each state, channel updating is done. As an example, let the minimum in Eq. (16) be achieved corresponding to $S_{k-1} = +1$, i.e., let the best path into $S_k = +1$ pass through $S_{k-1} = +1$. Then, the channel estimate in state $S_k = +1$ is given by $$\begin{bmatrix} h_0(S_k = +1) \\ h_1(S_k = +1) \end{bmatrix} = \begin{bmatrix} h_0(S_{k-1} = +1) \\ h_1(S_{k-1} = +1) \end{bmatrix} + \Delta e_k \cdot \begin{bmatrix} +1 \\ +1 \end{bmatrix} \quad (17)$$

where Δ is the coefficient step size, and $e_k$ is the error which is given by $$e_k = [r_k - h_0(S_{k-1} = +1) - h_0(S_{k-1} = +1)] \quad (18)$$

In Eq. (17), the first term on the right-hand side is the channel associated with state $S_{K-1} = +1$.

This process of retaining the best path into each state and then recalculating channel estimates coefficients is continued until the error given by Eq. (18) achieves a satisfactorily small value, i.e., until the channel coefficients converge to a stable set of values.

The above procedure assumed an initial training period to develop an initial estimate of the channel. Since no channel estimate is available initially in blind equalization, a worst case impulse response initialization is assumed. This is one for which the coefficients are either set to zero or set to have a Nyquist response, i.e., one coefficient (the center one) is initialized to one, and rest to zero. Since the channel is thus initially highly mismatched, the merge property of the VA cannot be readily exploited. This is so because for the worst case channel initialization all data sequences are equally likely to be the best; an incorrect candidate and the correct candidate are equally likely. This problem is alleviated in accordance with one aspect of the present invention by retaining more than one estimate (in general, K) of the data sequence in each state, as was taught generally in the above-cited patent application by Seshadri and Sundberg. Associated with each estimate of the data sequence is a channel estimate that is obtained using the well-known stochastic-gradient algorithm outlined above (given by Eq. (12)). The number of data sequence estimates, K, that should be retained at each state will vary with the type of channel and the modulation techniques used. Typically, about 4 to 8 of the lowest metric candidates are retained at each state.

This blind adaptation algorithm is further explained by example for the channel in FIGS. 2-4. It is assumed that the values of $h_0$ and $h_1$ are initially unknown to the receiver. In order to provide the blind adaptation capability, an initial assumption is made regarding the length of the channel impulse response, i.e., the number of channel coefficients (also called the order of the channel). For this example, the number is 2. This determines the number of trellis states. The state transistions are also known. For this example, possible state transitions shown in FIG. 2, for example, are $+1 \rightarrow -1$ and $-1 \rightarrow +1$. However, the output corresponding to a state transition is not known, since the outputs are determined in part by the unknown channel coefficients. An initial channel estimate is assumed, typically one where all the coefficients are set to zero. Further, the state at the beginning trellis search is assumed arbitrarily, for example, the state +1. An assumed is output corresponding to a transition from state +1 at time 0 to state +1 at time 1 is 0. The error between the received symbol and the hypothesized output is $r_1$ and the branch metric is $r_1^2$. Similarly, the error between the received symbol and the hypothesized output due to transition $+1 \rightarrow -1$ is also $r_1$ and the branch metric is $r_1^2$. Thus, at time 1, the two states have respective accumulated metrics of $r_1^2$.

The channel estimate for state +1 is now $$\begin{bmatrix} \hat{h}_0^1(1) \\ \hat{h}_1^1(1) \end{bmatrix} = \begin{bmatrix} \hat{h}_0^0(1) \\ \hat{h}_1^0(1) \end{bmatrix} + \Delta \cdot r_1 \cdot \begin{bmatrix} 1 \\ 1 \end{bmatrix} \quad (19)$$

and for state −1 is $$\begin{bmatrix} \hat{h}_0^1(-1) \\ \hat{h}_1^1(-1) \end{bmatrix} = \begin{bmatrix} \hat{h}_0^0(+1) \\ \hat{h}_1^0(+1) \end{bmatrix} + \Delta \cdot r_1 \cdot \begin{bmatrix} -1 \\ 1 \end{bmatrix} \quad (20)$$

The superscript for the h's denote time. For convenience, we have dropped the term S inside the bracket of h(.). At time 2, there are two paths entering state +1. For transition from +1 at time 1, the branch metric is evaluated using the channel coefficients as determined in Eq. (19). For transition from −1 at time 1, the branch metric is evaluated using the channel coefficients as specified in Eq. (20). These branch metrics are added to the respective accumulated metrics at time 1 to give the accumulated metrics at time 2 for state +1.

Normally, at this stage, the conventional Viterbi algorithm would have deleted one of the paths, namely the path with the highest metric. However, since we started with an initial channel estimate that corresponds to the worst case situation, there is a high probability of retaining the incorrect path. This problem is alleviated by retaining both of the candidates into state +1. For each of these paths, channel updating is performed. Thus, one channel estimate is obtained for each state. Similar computation is also performed for state −1 and two candidates are retained, along with respective updated channel estimates. At the next instant (time 3), four paths enter state +1 (and state −1). The branch metrics for each of the paths are calculated using the respective updated channel estimates. A maximum of K candidates are retained for each state where the value of K is obtained experimentally. For typical illustrative telephone and digital radio channel examples in this text, K ranges between 4 and 16. Thus, if the number of candidates entering a state is greater than K, then the candidates are sorted in the increasing order of their accumulated metrics. The K top candidates (candidates with the lowest metric) are retained. Thus, in the present example, if K=2, then at time 3, only 2 out of 4 candidates that enter each state are retained. This procedure continues until the rate of increase of the lowest metric is below a preselected threshold. Typically, this threshold value will depend on the noise variance. It proves advantageous to monitor the rate of increase over several intervals to insure stability below the threshold, i.e., to insure that convergence has indeed occurred. The methods to compute the K best candidates is taught in the above-cited patent application by Seshadri and Sundberg.

Once convergence has been obtained, the decoding algorithm switches to conventional Viterbi algorithm. The channel estimate corresponding to the path with the lowest metric is retained as the best channel estimate and the rest of the estimates are discarded. The present blind equalization technique can also be used to recalculate channel equalizer coefficients when a sudden change is experienced in the channel, as in a sudden fade. In such cases, either the then existing coefficients can be used as the initial conditions, or the all-zero (or other) initial conditions can be assumed.

Alternatively, any well-known equalization scheme can be used, after a reliable initial channel equalization has been achieved using the blind equalization technique of the present invention. The equalizer coefficients are determined from the best channel estimate coefficients as described above.

Preferably, however, the trellis search using multiple channel updating as described above in connection with FIG. 7 is used after blind equalization is achieved. Decoded output sequences are available from the trellis search after the channel estimates converge.

Reduced Constellation Approach to Blind Channel Identification

The techniques described above for blind equalization may prove somewhat burdensome to implement for some values of M and L, where M is again the input alphabet size, and L is the channel memory. Thus, in order to further reduce the complexity of implementation of embodiments of the present invention, a reduced constellation approach is advantageously used for the purpose of blind channel identification. In this variation, shown in illustrative form in FIG. 8, the decoder initially assumes that the transmitted data is binary with levels $\{\pm a\}$, where a is a scaling constant. The scaling constant determines only the gain of the channel coefficients. The number of states in the decoder trellis is now only $2^L$ in contrast to $M^L$ for full trellis searching. The decoder then attempts to find the best channel fit corresponding to the received sequence, assuming that the transmitted data sequence is binary.

Figure 8:
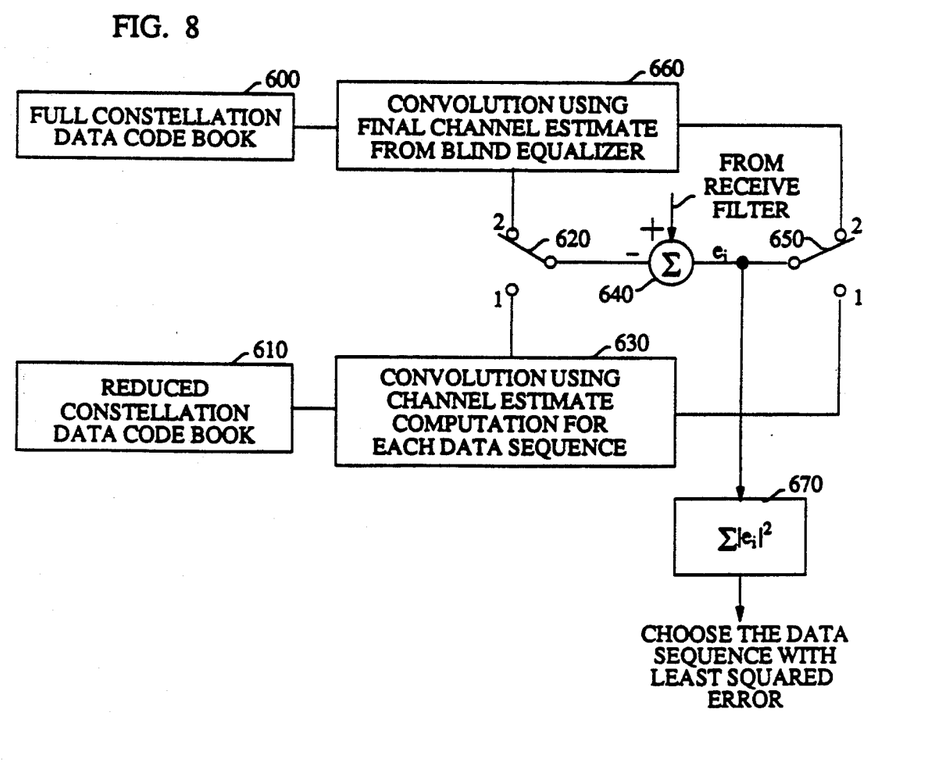
FIG. 8 shows a block diagram used in describing certain aspects of the present invention using a reduced signaling constellation.

FIG. 8 shows a system with two data sequence codebooks, full constellation codebook 600 corresponding to that indicated as 600 in FIG. 4, and a reduced-constellation codebook 610 typically having codewords in which the code symbols take only binary values. In operation, switch 620 is in position 1 during the blind mode, so that the codebook sequences are convolved in block 630 and compared in comparator 640 with the receive filter sampled output sequence, $r_i$, to form the error signal $e_i$. The error signal is then applied via switch 650 (in position 1) to update the channel coefficient estimates in block 630.

After the channel estimates in block 630 achieves some degree of convergence to the actual channel impulse response samples, switches 620 and 650 are moved to respective positions 2, to process the full M symbol signals. This determination is again made based on a stable reduction of the path metric increases below a threshold value. The coefficients arrived at during the blind equalization phase are then transferred initially to channel convolution block 660 and the coefficients are thereafter routinely updated as described above in full-constellation decoding. That is, the convolved output of the codebook is compared in comparator 640 and the normal M symbol decoding accomplished in block 670.

Typically, when M-ary PAM is used, the value of a is chosen as the mean of the level magnitudes of the M-ary PAM signal. For example, if the M levels are $\{\pm 1, \pm 3\}$ a might be chosen as 2. Once the channel is identified, standard approaches (tree or reduced state trellis searching) can be used to decode the data that was actually transmitted. For this purpose the data sequences received during blind equalization (and, when appropriate during final adjustment of channel coefficient in block 660) are stored until final convergence of the channel estimates. Then, such stored sequences are decoded; newly arriving sequences are processed after those that were stored.

The convergence of equalizer/decoder parameters in accordance with particular embodiments of the present invention will now be shown for typical channel impulse responses and for illustrative modulation techniques.

Figure 9:
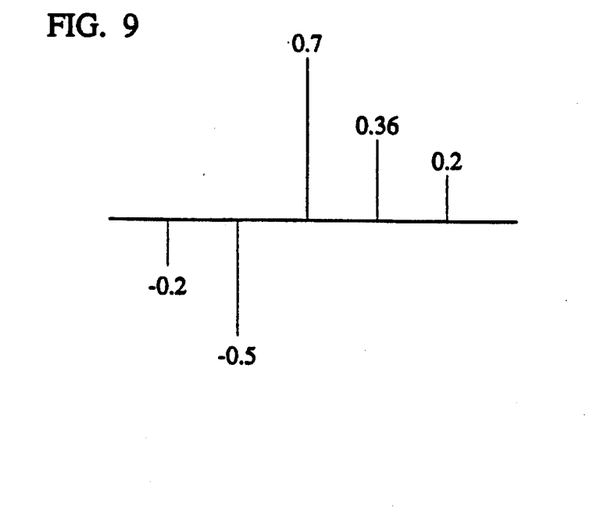
FIGS. 9, 10 and 11 show representations of communications channel impulse responses for typical channels a, b, and c, respectively.
Figure 10:
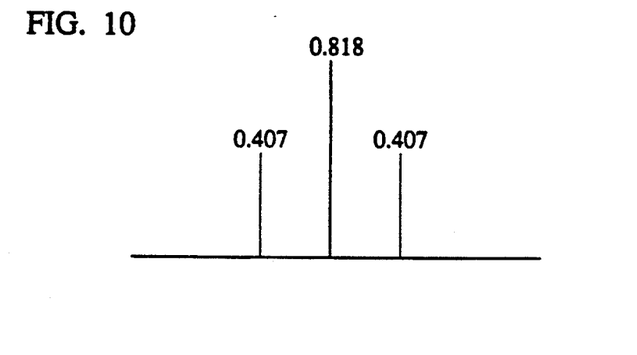
Figure 11:
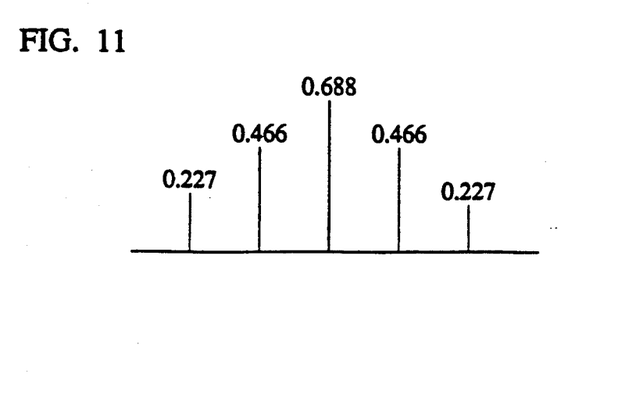

As a first example consider the system of FIG. 1 in which modulator 110 and demodulator 120 use M-ary PAM, where M=2, 4, 8. The data symbols are assumed to be independent and identically distributed (iid), and, generally, are drawn from the set $\{\pm 1, \pm 3, \ldots, \pm(M-1)\}$. Discrete channel impulse responses for representative channels a, b, and c, are shown in FIGS. 9, 10, and 11, respectively. Channel a (FIG. 9) exhibits both amplitude and phase distortion, while channels b and c (FIG. 10) exhibit only amplitude distortion. Channel b has a spectral null at the band edge while c (FIG. 11) has an in-band spectral null.

Prior art techniques for linear equalization of these channels can be shown to be particularly difficult for channel c. No such problems are encountered by the blind equalizer in accordance with the present invention.

While it proves convenient to assume ideal carrier recovery in performing the convergence tests, such need not be the case. Thus, decision directed carrier recovery can be accomplished, e.g., by updating the phase using a first order phase locked loop for each surviving data sequence.

FIGS. 12-15 show the performance of the present invention for typical channels. In particular, these figures show the mean squared error varies as a function of channel estimation symbols received. The mean squared error is obtained by averaging errors over several independent data blocks and noise samples. The sample squared error for a particular block is defined as $$\Delta(k) = \sum_{i=0}^{L} [\hat{h}_i - h_i(k)]^2 \qquad (21)$$

where $\{h_i\}_{i=0}^{L}$ are the true channel coefficients, and $\{\hat{h}_i(k)\}_{i=0}^{L}$ are the estimated channel coefficients after observing k received samples. The average squared error is obtained as $$\Delta(k) = \frac{1}{N} \sum_{j=1}^{N} \left[ \sum_{i=0}^{L} [h_i - h_{ij}(k)]^2 \right] \qquad (22)$$

where $h_{ij}(k)$ is the estimate of the $i^{th}$ channel coefficient for data block j after observation of k samples. The parameter N is the number of data blocks that are used in evaluating the average squared error. A value of N=10 has been used as typical. In these measurements the signal-to-noise ratio has been defined as $1/\sigma^2$. However, the average transmitted signal power has not been normalized to be unity; it is actually $$2 \cdot \left( \frac{1^2 + \ldots + (M-1)^2}{M} \right).$$

So the actual SNR is greater by this factor.

Figure 12:
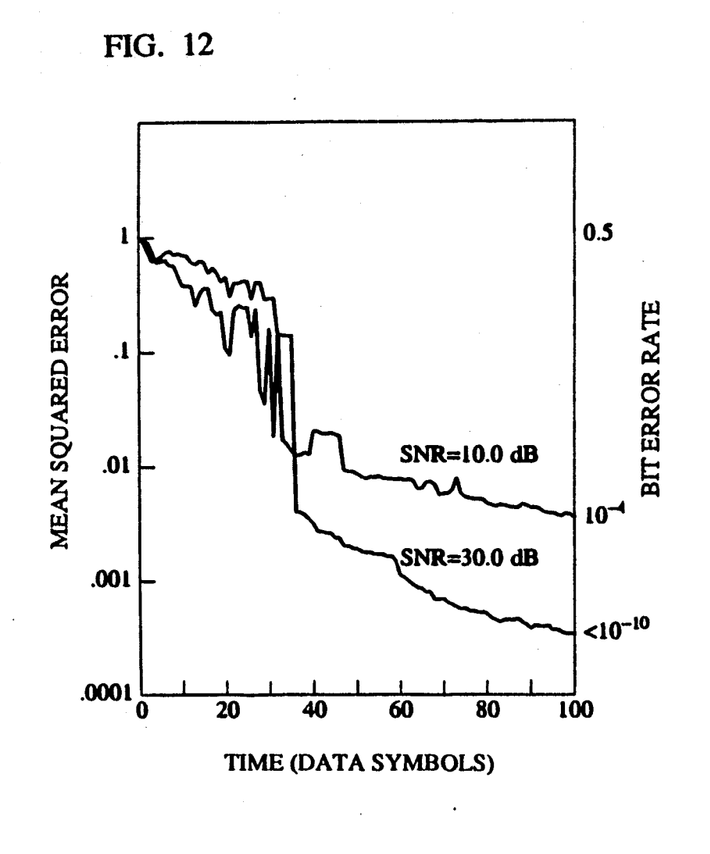
FIGS. 12 and 13 show typical learning curves for 2-PAM: Channel estimate MSE vs. Time (Data Symbols) for channels a and b, respectively.
Figure 13:
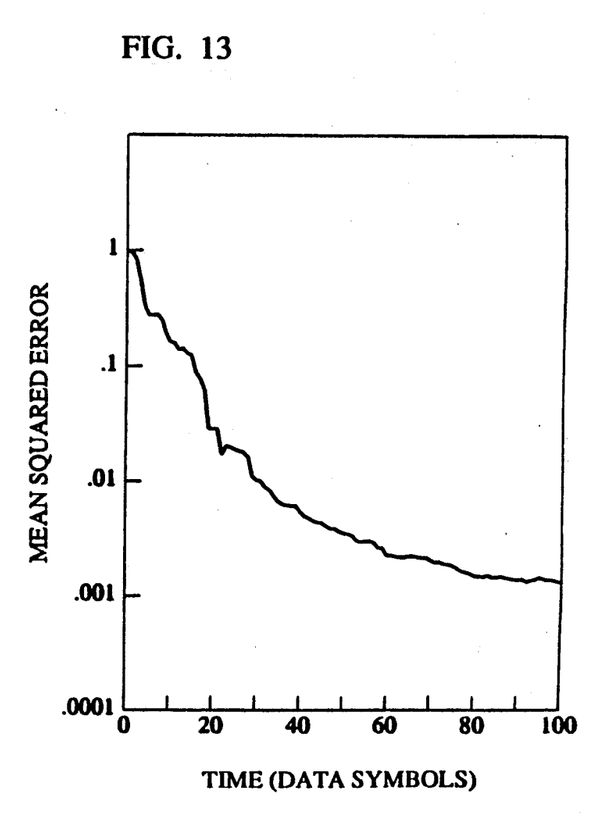

FIGS. 12 and 13 show convergence plots for binary signaling (i.e., M=2) over channels a and b. In each case, 4 paths are retained for every state. The initial channel estimate is assumed to be zero in all cases. We note that convergence occurs within 100 symbols in all the cases. While the results are for an SNR=$1/\sigma^2$ of 30 dB, fast convergence is observed even at low SNR (10 dB) as shown in FIG. 8a for channel a. The sudden drop in mean squared error occurs because of the absence of time alignment of the true and the estimated channel impulse response. Because of this, the error appears to be higher than it is in practice.

Figure 14:
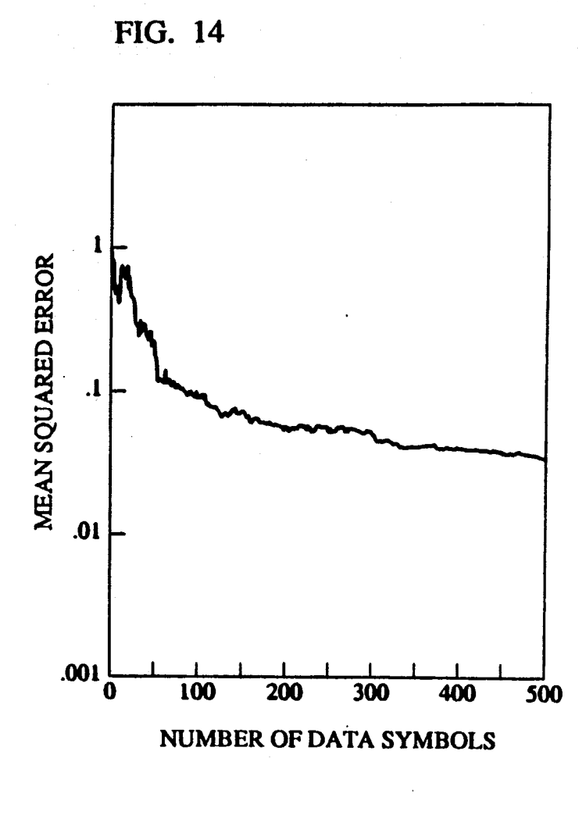
FIGS. 14 and 15 show MSE convergence plot for 8-PAM channel signals, for channels a and c, respectively.
Figure 15:
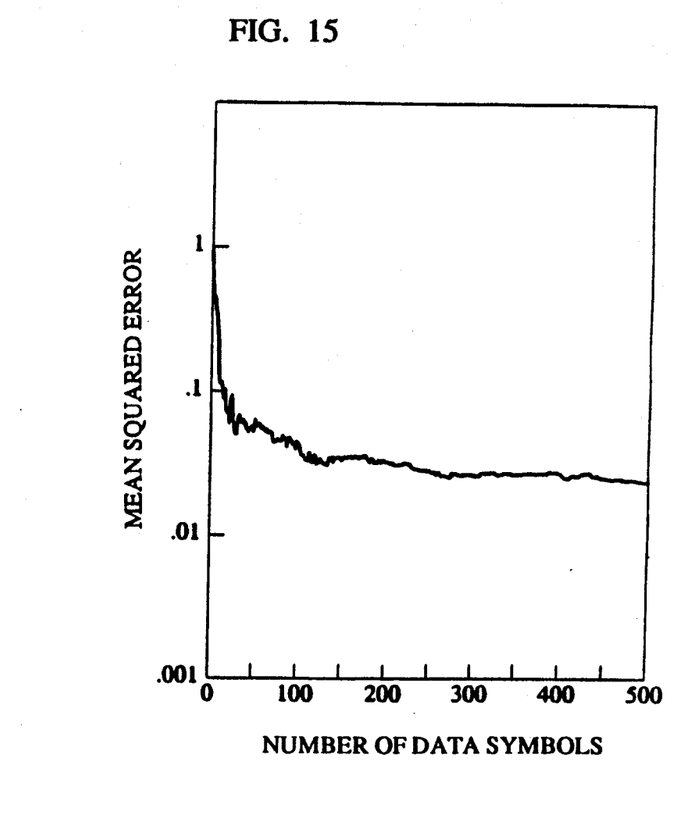

FIGS. 14 and 15 show the convergence plot for 8-PAM constellation over channels a and c. In these examples, 8 paths are retained per state and good convergence characteristics of the algorithms are observed.

The above-described reduced constellation approach is used here to good advantage. Thus, if not for the reduced constellation approach, the number of trellis states would be 4096 for channels a and c with 8-PAM signaling, a factor of 256 increase in complexity, rendering the original algorithm less practical.

An Iterative Method of Blind System Identification

Until now, it has been assumed that the decoder and the channel memories are identical. In practice, the extent of the channel memory is not known to the decoder a priori. In this situation, it is possible to use an iterative method, illustrated generally in Tables 1a and 1b, of blind system identification, where the decoder starts with the assumption that the channel memory is small, and the reduced order channel fit is found. Next, the order of the system is increased, typically by one or two, and the algorithm is run once again. Note that in running the algorithm the second or third time, the number of paths that need to be retained at each state can be decreased to one or two. The reason is that a good (reduced order) initial channel estimate is available as a result of the first iteration.

Table 1a shows the result of using this approach for 2-PAM signaling over channel a. Ten blocks of data are transmitted, each consisting of 200 symbols. Each block is subjected to independent noise samples. A third order system is identified in a blind mode corresponding to the received data. The estimate coefficients are arranged so that the estimate coefficient with the highest magnitude is at the center (h(2)). Table 1b shows the result of increasing the order from 3 to 5. The number of survivors for each state which was 8 for identifying the reduced order system is decreased to 1 for each state when the system order was increased.

While particular illustrative embodiments of the present invention have been described above, it should be understood that numerous other implementations within the spirit and scope of the present invention will find application by those skilled in the art. Thus, for example, particular applications will find it useful to apply different error criteria in applying the principles of the present invention. Likewise, other than all possible received sequences may be used in forming comparisons with a received sequence.

While circumstances may dictate particular processors to be used, one class of processor systems that will prove useful in performing the various arithmetic operations described above are those based on the DSP32C processors marketed by AT&T. In other cases, programmed general purpose processors may be used as will be clear to those skilled in the art.

TABLE 1a

2 Paths/State
First Iteration
200 Bits/Block
$3^{rd}$ Order Channel Estimate

| Block No. | h(0) = −0.2 ĥ(0) | h(1) = −0.5 ĥ(1) | h(2) = 0.7 ĥ(2) | h(3) = 0.36 ĥ(3) | h(4) = 0.2 ĥ(4) |
|---|---|---|---|---|---|
| 1 | 0.0 | −0.54 | 0.7 | 0.48 | 0.0 |
| 2 | 0.0 | −0.62 | 0.71 | 0.46 | 0.0 |
| 3 | 0.0 | 0.0 | 0.83 | 0.56 | 0.07 |
| 4 | 0.0 | −0.5 | 0.70 | 0.43 | 0.0 |
| 5 | 0.0 | −0.48 | 0.67 | 0.29 | 0.0 |
| 6 | 0.0 | 0.0 | 0.90 | 0.38 | 0.47 |
| 7 | 0.0 | −0.41 | 0.79 | 0.25 | 0.0 |
| 8 | 0.0 | −0.46 | 0.73 | 0.32 | 0.0 |
| 9 | 0.0 | −0.45 | 0.80 | 0.41 | 0.0 |
| 10 | 0.0 | −0.46 | 0.83 | 0.46 | 0.0 |

TABLE 1b

1 Path/State
Second Iteration
200 Bits/Block
$5^{th}$ Order Channel Estimate

| 1 | −0.22 | −0.49 | 0.70 | 0.36 | 0.22 |
|---|---|---|---|---|---|
| 2 | −0.22 | −0.49 | 0.73 | 0.34 | 0.19 |
| 3 | 0.0 | −0.5 | 0.81 | 0.37 | 0.23 |
| 4 | −0.24 | −0.5 | 0.68 | 0.32 | 0.22 |
| 5 | −0.2 | −0.52 | 0.66 | 0.32 | 0.18 |
| 6 | −0.2 | −0.5 | 0.68 | 0.32 | 0.22 |
| 7 | −0.25 | −0.49 | 0.71 | 0.33 | 0.22 |
| 8 | −0.22 | −0.50 | 0.69 | 0.38 | 0.18 |
| 9 | −0.22 | −0.5 | 0.71 | 0.40 | 0.21 |
| 10 | −0.18 | −0.5 | 0.72 | 0.38 | 0.23 |

I claim:

1. A method of estimating sequences of data signals received from a channel, each of said sequences of data signals corresponding to a transmitted sequence of N symbols, each of said N symbols being from an M-symbol alphabet, said channel having channel memory giving rise to intersymbol distortion, said channel memory being defined by L parameters, L, M and N being integers, the method comprising the steps of:
   performing a delayed decision decoding of each received sequence of data signals in an N-stage trellis decoder having $M^L$ states at each stage,
   said decoding comprising computing at each stage cumulative error metrics for possible transmitted sequences leading to the states in said stage,
   said error metrics being based on a comparison of said received sequences of data signals with results of convolutions of sets of values for said L parameters and said possible transmitted sequences,
   identifying one or more of said possible transmitted sequences and corresponding one or more sets of values for said L parameters which yield lowest values for said cumulative error metrics at each state,
   adjusting said sets of values for said L parameters for each identified possible transmitted sequence at each state based on the cumulative error metric for said identified possible transmitted sequence, and
   selecting as a transmitted sequence the identified possible transmitted sequence having the lowest value for said metric when said adjusting involves changes in the set of values for said L parameters for said identified possible transmitted sequence which are less than a predetermined magnitude.

2. The method of claim 1 wherein said L parameters correspond to contributions to channel output of L adjacent symbols in said possible transmitted sequences, and wherein said step of adjusting comprises the step of selecting values for said L parameters which tend to minimize said cumulative error metrics for subsequently received sequences of data signals.

3. The method of claim 2 wherein said step of decoding comprises the steps of
retaining at each state of said decoder, K most likely possible transmitted sequences leading to said state, K being a preselected integer, and
retaining said cumulative error metrics for all of the K most likely possible transmitted sequences corresponding to the received sequence of data signals.

4. The method of claim 2 wherein said decoding comprises the step of performing a non-exhaustive search of said error metrics for possible transmitted sequences corresponding to received sequences of data signals.

5. The method of claim 2 wherein said decoding is performed using a Generalized Viterbi algorithm in which less than all of said possible transmitted sequences leading to each state are retained and estimates for said L parameters are computed for each of the retained possible transmitted sequences.

6. A method for compensating for distortion introduced by a communication channel comprising the steps of:

receiving data signals in time sequence from said channel, each of said data signals corresponding to a symbol in an M symbol alphabet, convolving all possible sequences of length N of said M symbols, where N is a preselected number of symbols in each sequence, with estimates of channel characteristics to generate convolved sequences of length N, deriving an error metric for each convolved sequence relative to the received sequence, identifying convolved sequences which yield lowest values for said metric, and adjusting said estimates of channel characteristics based on said convolved sequences yielding said lowest values for said metric.

7. The method of claim 6 wherein, for an integer R, said convolving is performed for a plurality of candidate sequences for a transmitted sequence, said candidate sequences being constrained to include sequences containing R<M different symbols.

8. The method of claim 7 wherein R=2.

9. The method of claim 8 wherein said R=2 symbols are ± a, where a represents the magnitude of an average value for symbols of a common sign or sense in said set of M possible symbols.

10. The method of claim 6, further comprising
storing said received sequence until said estimates of said channel characteristics converge to reliable values, and decoding said received sequence when said channel estimates remain reliable.

11. The method of claim 10, wherein said decoding is accomplished using a Viterbi algorithm decoder.

12. The method of claim 6 or 7 wherein all of said channel characteristics are initially set to zero.

13. The method of claim 6 or 7 wherein all of said channel characteristics except one are initially set to zero.

14. The method of claim 6, wherein initial values for said channel characteristics at startup or upon channel changes are known only approximately, and said convolving, deriving and identifying steps comprise determining cumulative error metrics for said possible sequences in a delayed decision decoder having N ordered stages, each of said stages having $M^L$ states, and each transition from a state in one stage to a state in a following stage having associated therewith one of said error metrics, said cumulative error metrics corresponding to the sum of said error metrics for the states in each of said stages, retaining K possible transmitted sequences entering each state of said decoder, K being an integer, and wherein said adjusting of said estimates of said channel characteristics is performed for at least one of said retained possible transmitted sequences.

15. The method of claim 14 where K=1.

16. The method of claim 14 where said adjusting is accomplished using a stochostic gradient technique.

17. The method of claim 14 wherein said adjusting is performed using only the retained possible sequence having a lowest cumulative metric at each state.

18. A system for estimating transmitted data symbols based on signals received from a channel exhibiting distortion comprising:

a decision-directed decoder using a delayed decision decoding algorithm based on estimates of an integer number, L, of parameters used to characterize said channel, said decision-directed decoder comprising means for generating error signals reflecting differences between said received signals and possible transmitted signals as distorted by a channel defined by said L estimates, means for updating said L estimates based on said error signals, means for storing said received signals until said updated estimates converge to values that remain stable within respective ranges of values for a sufficient period of time to indicate that the estimates are reliable, and means for reapplying said stored received signals to said decoder after said convergence is achieved, thereby to estimate said transmitted symbols with improved reliability.

19. The system of claim 18
wherein
said delayed decision decoder is a Viterbi Algorithm decoder comprising a trellis having paths passing through a plurality, L, of stages, each such path representing a sequence of possible transmitted symbols, each of said paths having a cumulative error metric at each stage, and wherein, for K≦L, where K is a predetermined integer constant representing a preselected number of sequence estimates, said means for updating at the Kth stage of said trellis is based on one or more K-symbol sequence candidates having the lowest metrics.

20. The system of claim 19 wherein
said Viterbi Algorithm decoder is one in which K≧1 paths having the lowest metrics are retained at each state of said trellis, and
said means for updating includes means for updating said L parameters using error signals based on one or more of said retained paths.

21. The system of claim 19, wherein
said transmitted symbols are selected from an alphabet of M possible symbols, and
wherein said decoder comprises means for basing updates to said L parameters on possible transmitted sequences having fewer than M symbols until said parameter values have achieved a first degree of stability, and
wherein said decoder comprises means for basing updates to said L parameters on possible transmitted sequences having M symbols after said parameter values having achieved said first degree of stability.

* * * * *